United States Patent [19]

Scholz

[11] Patent Number: 4,627,094

[45] Date of Patent: Dec. 2, 1986

[54] ELECTRONIC AUDIO SIGNAL PROCESSOR

[76] Inventor: Donald T. Scholz, 13 Rich Valley Rd., Wayland, Mass. 01778

[21] Appl. No.: 745,856

[22] Filed: Jun. 17, 1985

Related U.S. Application Data

[63] Continuation of Ser. No. 637,073, Aug. 2, 1984, abandoned, which is a continuation of Ser. No. 457,124, Jan. 11, 1983, abandoned, which is a continuation-in-part of Ser. No. 420,280, Sep. 20, 1982, Pat. No. 4,584,700.

[51] Int. Cl.[4] .......................... H03G 3/00; H03G 7/00

[52] U.S. Cl. .......................................... 38/61; 381/106; 333/14

[58] Field of Search .................... 381/61, 98, 101–104, 381/106, 118; 84/DIG. 9; 333/14, 17 L

[56] References Cited

U.S. PATENT DOCUMENTS

| | | | |
|---|---|---|---|
| 3,304,369 | 2/1967 | Dreyfus | 381/106 |
| 4,072,914 | 2/1978 | Haramoto et al. | 381/106 X |
| 4,363,006 | 12/1982 | Ishigaki et al. | 333/14 |
| 4,400,583 | 8/1983 | Bloy | 381/98 |
| 4,490,691 | 12/1984 | Dolby | 381/106 X |
| 4,538,297 | 8/1985 | Waller, Jr. | 381/106 X |

FOREIGN PATENT DOCUMENTS

| | | | |
|---|---|---|---|
| 2485836 | 12/1981 | France | 381/106 |

OTHER PUBLICATIONS

*Electronics Today International,* vol. 8, No. 10, Oct. 1979, pp. 47–49, "Project:Audio Compressor".

*Wireless World,* vol. 83, No. 1497, May 1977, p. 80, "Speech Compressor/Limiter.

*Primary Examiner*—Keith E. George

*Attorney, Agent, or Firm*—Wolf, Greenfield and Sacks

[57] ABSTRACT

In an electronic audio signal processor suitable for electrical instruments such as electrical guitars, there is provided an improved pre-amplifier and compressor circuit which compresses the amplitude level of an inputted audio signal so as to provide lower noise better weak note recovery and improved high end boost, for low volume signals when the output thereof is fed through a distortion amplifier. The compressor circuit includes an op amp and feedback FET transistor.

15 Claims, 4 Drawing Figures

ELECTRONIC AUDIO SIGNAL PROCESSOR

RELATED APPLICATION

This application is a continuation of Application Ser. No. 637,073 filed Aug. 2, 1984, now abandoned, which in turn is a continuation of Application Ser. No. 457,124 filed Jan. 11, 1983, now abandoned, which in turn is a continuation-in-part of Application Ser. No. 420,280 filed Sept. 20, 1982 now U.S. Pat. No. 4,584,700.

BACKGROUND AND SUMMARY OF THE INVENTION

The present invention relates in general to apparatus for handling electric audio signals for producing controlled distortion in the audio output signals and for enhancing the tonal quality thereof. More particularly, the present invention is directed to an improved compressor circuit which from a general standpoint, compresses the intensity range of the output signal therefrom as compared to the range of the input signal thereto.

Accordingly, an object of the present invention is to provide an improved electronic audio signal processor particularly having improved tonal quality of the audio signal.

A further object of the present invention is to provide an improved compressor circuit which forms a part of the electronic audio signal processor and which is characterized by lower noise operation particularly in the distortion mode of operation.

Still another object of the present invention is to provide an improved compressor circuit which is characterized by high end boost or enhancement, particularly at low volume operation.

Another object of the present invention is to provide an improved compressor circuit in accordance with the preceding objects and is characterized by improved weak note recovery operation.

To accomplish the foregoing and other objects of this invention, there is provided in an electronic audio signal processor, an improved signal compressor circuit for receiving the output from a high pass audio filter and for producing an output signal having increased low audio and high audio signal content relative to the middle audio signal content. In particular, the circuit of the present invention is characterized by lower noise, particularly in the distortion mode of operation, is also characterized by a high end boost at low volume and by better weak note recovery. In the disclosed embodiment of the invention the compressor circuit comprises an operational amplifier having associated therewith in a feedback loop, an FET transistor with the output of the FET transistor coupled back to the operational amplifier by a unique circuit in the form of an RC circuit that provides the aforementioned improved operation.

BRIEF DESCRIPTION OF THE DRAWINGS

Numerous other objects, features and advantages of the invention should now become apparent upon a reading of the following detailed description taken in conjunction with the accompanying drawing, in which.

DETAILED DESCRIPTION

Figure 1:
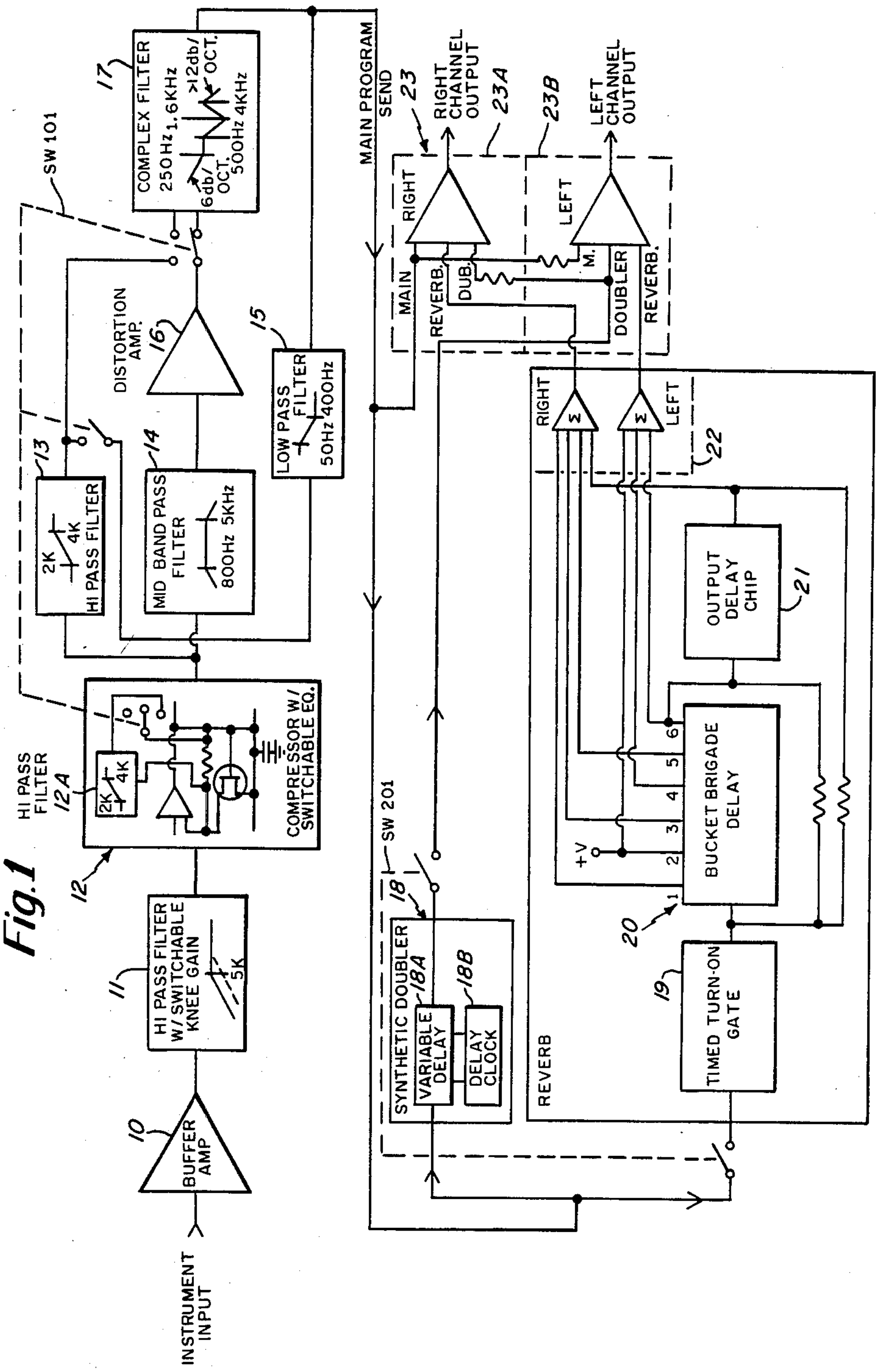
FIG. 1 is an overall block diagram of an electronic audio signal processor incorporating the concepts of the present invention.

While this invention is susceptible of embodiment in many different forms, there is shown in the drawings and will herein be described in detail one specific embodiment with the understanding that the present disclosure is to be considered as an exemplification of the principles of the invention and is not intended to limit the invention to the embodiment illustrated. While the description of the preferred embodiment may at times refer to audio signals from musical instruments such as electric guitars, it is to be understood that application of the invention is not limited to musical instruments or electric guitars.

As used herein, the term "low" when used in conjunction with low pass filters and the like is intended to refer to a range starting at about 50 Hz and ending at about 250 Hz to 800 Hz. will herein be described in detail one specific embodiment with the understanding that the present disclosure is to be considered as an exemplification of the principles of the invention and is not intended to limit the invention to the embodiment illustrated. While the description of the preferred embodiment may at times refer to audio signals from musical instruments such as electric guitars, it is to be understood that application of the invention is not limited to musical instruments or electric guitars.

As used herein, the term "low" when used in conjunction with low pass filters and the like is intended to refer to a range starting at about 50 Hz and ending at about 250 Hz to 800 Hz. In the same context, the word "middle" or "mid" is intended to refer to the range starting at about 250 Hz to 800 Hz and ending at about 2 KHz to 5 KHz. Lastly, the word "high" is intended to refer to the range starting about 2 KHz to 5 KHz and ending somewhere in the upper audio frequency spectrum.

The compressor as described herein is intended to refer to a device which compresses the intensity range of the output signal as compared to the range of the input signal, and more particularly to a device which amplifies weak signals and attenuates strong signals to produce a smaller output range for a given input range. The distortion amplifier is intended to refer to a device which functions as a linear amplifier up to a certain point of input signal level and then clips above that certain level in order to produce controlled distortion. In the preferred embodiment, the distortion amp functions to cause intermodulation of the input signals and to produce high harmonics of the low range and mid range audio content of the input signal, generally independently of the high range content of the input signal. The doubler (synthetic doubler) produces an output signal which varies in pitch from its input singal, so that its output signal simulates an instrument different from the instrument providing the input signal. When the output of the doubler is combined with the input by a summer or mixer the result is like two separate instruments.

For purposes of description, the preferred embodiment according to the invention has two main portions: a controlled distortion and tone alteration and sustain alteration portion, and a reverberation portion.

The portion of the preferred embodiment which is directed to controlled distortion tone alteration and sustain operates in one of four modes, as controlled by a selector switch. In each mode a different combination of filters and devices are connected serially in a chain after a buffer amp 10 and high pass filter 11 as shown in FIG. 1. The filter 11 increases the mid and some of the high range part of the input signal which decay faster, causing the compressor to react more to the mid range part of the signal than to the low range part of the signal. This allows the compressor to maintain the mid range at a more constant level as a note decays, which is more pleasing when heard directly, and is important when its output is connected to the distortion amp 16 and a complex filter 17. In the second mode, the chain consists of the compressor 12 with the high end EQ boost 12A, a high pass filter 13 and the complex filter 17. In the third mode, the chain consists of the compressor 12 without the high end EQ boost 12A, the high pass filter 13 and the complex filter 17. In the fourth mode, the chain consists of the compressor 12 without the high end EQ boost 12A, and a low boost EQ 15.

In the first operational mode, the distortion amp 16 is used for adding substantial controlled distortion. The mid band pass filter 14 reduces the high and low signal content before the signal goes through the distortion amp 16. Rolling off the highs results in less noise at the output of the distortion amp and reduces the amount of highs from the input signal heard after the distortion amp 16. This is important because in this substantial distortion mode it is important that the high end content of the output signal be made up primarily of high harmonics produced by distorting the mid range portion of the signal which are of long duration, rather than by the natural high harmonics contained in the input signal which are of short duration. Also, the high pass filter 11 is modified in this mode by opening the switch 100 which causes the filter to level off at a lowered frequency thus providing less high end content. The rolling off of the lows is important as this reduces modulation of the output signal by the low end content of the input signal. Actually, the low signal content is reduced twice; once at the high pass filter 11 after the buffer amp 10, and again at the mid band pass filter 14.

The compressor 12 receives a wide amplitude range of signals and outputs an output signal having a relatively narrow amplitude range. The compressor 12 is designed so that its output is fixed at a good level for generating harmonics within the distortion amplifier 16. Therefore, one advantage of having the compressor 12 in front of the distortion amp 16 is so that the harmonics generated by the distortion amp 16 can be controlled by the operation of the compressor 12.

The importance of the compressor 12 will be understood more readily if one considers what the resultant signal would be like without a compressor. If a distortion amplifier were to receive signals directly from a stringed musical instrument a very loud signal is produced when the string is first plucked, and a certain associated distortion characteristic will be produced. When the signal dies out or decays, the character of the signal changes dramatically. Therefore the difference in distortion outputs, with the signal increased, is very pronounced and significant.

One aspect of the invention is directed to minimizing the difference between the initial output of the distortion amplifier 16 and the subsequent sustained output of the distortion amplifier. In order to get sustain out of a musical note, a compressor 12 is used to prevent the signal from dying out or decaying as quickly and keeps the signal near a maximum output level for a certain time period. This signal is fed into the distortion amplifier 16 or distortion generator which generates harmonics.

The mid band pass filter 14 in front of the distortion amplifier 16 is fairly important in obtaining a distorted musical sound having good waveform quality, as is the compressor 12 bipass EQ 11. The complex filter 17 which receives the output of the distortion device, processes this output into an output signal having excellent tonal qualities. Without this filter, the output would be both "harsh" and "muddy" in tonal quality.

In a second operational mode, the gain of an operational amplifier in the compressor state 12 will be reduced, thereby cancelling some of the effect of the compressor unit 12, and reducing the level of the signal going into the distortion amp 16. The distortion amp 16 will not stay in the distortion state quite as long. Each time a note is played on the guitar, distortion will occur, but only for a brief time period.

The distortion amplifier 16 produces more high harmonics as the amp 16 is driven harder. Therefore, when the distortion amp 16 is not driven hard, lesser high harmonics are produced. In order to compensate for this, a high end EQ boost 12A (high pass filter) can be switched into in the compressor state 12, resulting in additional high end signal content, when this reduced gain mode is selected.

As the signal decays, the generated highs will diminish as the distortion amp 16 returns to the linear range of operation and no longer outputs a distorted signal. Since the distortion amp is no longer producing as much high end, a high end EQ boost 12A in the compressor is switched in this second mode. The high end produced will compensate for the fact that the distortion amp 16 is not producing as much high end, resulting in approximately the same amount of high signal content, but without as much distortion. This mode of operation may be desirable for guitar players who desire only a slight amount of distortion for pop music, instead of heavy rock and roll type sustained distortion.

The importance of having the high end EQ boost 12A before the distortion amp 16 can be illustrated by considering what sound would result by having a high end EQ boost after instead of before a distortion amp. Then the high harmonics synthetically generated by the distortion amp would also be amplified or boosted, and the distorted tones would be boosted, and the true guitar sounds would be masked too much by the distorted guitar tones. However, by putting a high end EQ boost before the distortion amp 16, the boost has substantially no effect on the high harmonics that the distortion amp produces because the output of the distortion amp is more dependent on the mid range content of the signal than the high range. Therefore, it is important that the high end EQ boost 12A associated with the compressor 12 be placed in front of the distortion amp 16 when the distortion amp is driven at lowered signal levels. This output is then processed by the complex filter 17 to improve its tonal qualities.

In the third operational mode, the chain consists of the compressor 12 without the high end EQ boost 12A, a high pass filter 13 and the complex filter 17. This operational mode might be used by musicians who desire a clean sound without controlled distortion. The distortion amplifier 16 used in the first operational mode outputs a relatively large amount of high end signal content by adding high harmonics. Since the distortion amplifier is not used in this operational mode, the high pass filter 13 increases the higher harmonic content of the signal and thus compensates for the absence of the distortion amplifier 16. The complex filter 17 was designed primarily to process the output of the distortion amplifier 16 but is used in this mode to make the tone more similar to that of the first and second operational mode. The complex filter 17 functions so that its output has a relatively large amount of low end and mid range signal content and rolls off dramatically at its upper end due to the large high end signal content produced when the distortion amp is being used. However, since the distortion amplifier is not used in the third operational mode, instead of eliminating the complex filter and replacing it with a separate second complex filter for use in this second operational mode, a simpler high pass filter 13 is provided in cascade with the complex filter 17. The high pass filter 14 will compensate somewhat for the bass heavy response of the complex filter 17. filter for use in this second operational mode, a simpler high pass filter 13 is provided in cascade with the complex filter 17. The high pass filter 14 will compensate somewhat for the bass heavy response of the complex filter 17.

Since the complex filter 17 has a peak in the mid range at about 500 Hz with a dip at 250 Hz and 1.6 KHz, the device will process the signal from a rather toneless guitar into a signal with enhanced tonal qualities in the same way the good stringed instruments with good tonal qualities have heavy response areas in the mid range. For guitars which already have good tonal response in the mid range, some additional mid range tone will be obtained.

In the fourth operational mode, the chain consists of the compressor 12 without the high end EQ boost 12A, and a low end EQ boost 15. This operational mode omits the distortion amplifier 16 and complex filter 17 present in other operational modes, and is primarily for keyboard instruments or for jazz guitarists who want a truer sound without substantial emphasis or de-emphasis of the tonal qualities of the musical instrument. The lower end of the audio frequency spectrum is boosted by the low end lost through the high pass filter 11. However, total compensation is not achieved, since if the high pass filter 13 and low pass filter 15 are superimposed, the resultant filter would be flat from 50 to 400 Hz and then climb to about 5 KHz where it would flatten out.

FIG. 1 also shows the reverberation portion of the overall circuit. One again, reference is made to the copending application Ser. No. 420,280 which sets forth further details of this portion of the circuit. Because this portion of the circuit does not pertain to the concepts of the invention described herein, it is not described in detail. However, in brief, this portion of the circuit comprises a doubling circuit 18, timed turn on gate 19, an analog shift register bucket brigade device 20 with delay taps including its associated input buffer amp and filter circuit 20A, an output delay circuit 21, an output summing and amplifier circuit 22, and an output amplifier and mixing circuit 23. This portion of the preferred embodiment operates in one of three modes to provide doubling alone, reverb alone, or both doubling and reverb.

Figure 2:
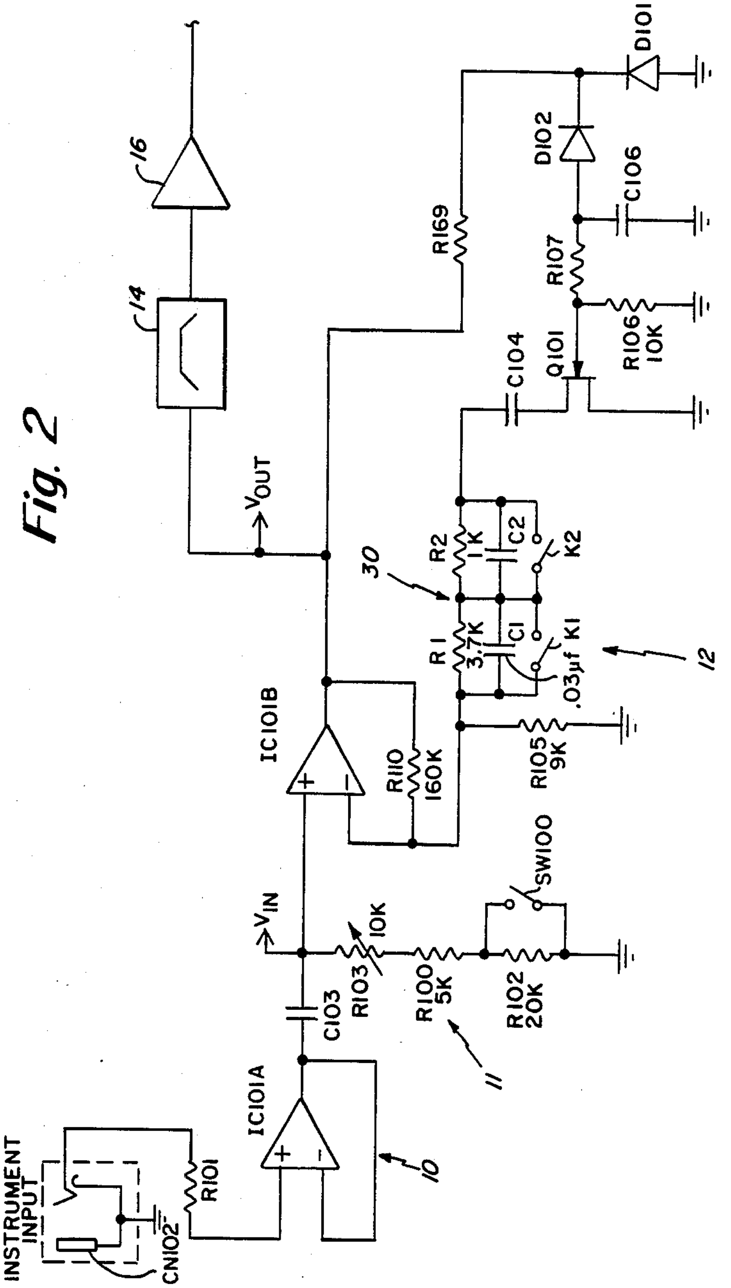
FIG. 2 is a detailed diagram of the compressor circuit showing the preferred circuit construction in accordance with the invention.

With reference now to FIG. 2, there is shown a buffer amplifier 10 which comprises integrated circuit IC101A which receives an electrical input signal from a musical instrument or any other device producing audio signals through monaural connector CN102 and resistor R101. The output of the buffer amplifier 10 is provided to a high pass filter circuit 11 comprising resistors R100 and R102 along with potentiometer R103, capacitor C103 and switch SW100.

Switch SW100 provides a means to adjust the point of the roll-off or knee between one frequency position of about 5 KHz (for "clean" sounds) and a higher frequency position(for "distorted" sounds). The high pass filter 11 has a roll-off of increased attenuation with a decrease in frequency of about 6 db per octave. When the switch position dictates a lower knee, the gain of the mid-range is higher by about 6 db. Accordingly, with the increase in gain the large signal inputted to the op amp IC 202B will probably push it into distortion at all times. Actually switch SW100 is mechanically tied to switch SW101, so that switch SW100 is open only when switch SW101 is in its uppermost position. In this position the device operates in the first mode, i.e. with the mid band pass filter, with the high end EQ boost 12A in the compressor stage 12.

The switch 101 is shown in FIG. 1 and reference is also now made to the aforementioned copending application Ser. No. 420,280 which is hereby incorporated by reference hereinto and which shows the further details of the connection of the switch SW101. In particularly, in copending application Ser. No. 420,280 reference is made to FIG. 2 which shows the interconnection of the switch SW101 to the other circuitry.

In FIG. 2 the output of the high pass filter 11 is coupled to the compressor circuit 12. As mentioned previously, the compressor circuit 12 amplifies weak signals and attenuates strong signals to produce a smaller amplitude range compared to the amplitude range at its input. The compressor circuit essentially comprises an amplifier IC101B and an FET transistor Q101 which serves to compress or reduce the amplitude range of the signal appearing at the input of the amplifier IC101B. In FIG. 2 it is noted that the output from the FET transistor Q101 couples by way of an RC network described in detail hereinafter to the feedback of negation input of the amplifier IC101B.

The output of the operational amplifier IC101B couples through a resistor R169 to a pair of diodes D101 and D102. This signal is also coupled by way of diode D102 to capacitor C106 and to series resistor R107 to the control electrode of the FET transistor Q101. There is also provided a parallel resistor R106. One of the output electrodes of the transistor Q101 is grounded and the other output electrode couples by way of capacitor C104 and by way of the network 30 back to the negation input of the amplifier IC101B.

When the output of the operational amplifier IC101B exceeds a certain level, the resistance of the FET goes up and cuts down the feedback of the amplifier. The diode D101 serves to limit the amount of compressing that the FET Q101 can perform. When the output signal from the amplifier increases, the diode D101 effectively reduces the resistance. Thus, as soon as the signal gets above the threshhold level of the diode D101, the signal is essentially passed to ground. Therefore, as soon as the signal gets larger, the FET gate increases resistance until it gets to a certain point. At that point the signal level across the gate of the FET will not increase. If the operational amplifier signal increases, the FET resistance stops increasing at a certain point and intentionally lets the signal build up going through the operational amplifier.

One reason why an upper limit is placed on the FET transistor Q101 is because of the operating characteristics of the FET. As the signal increases at the gate of the FET, the resistance across it increases. At first the resistance goes up smoothly and relatively linearly. However, above a certain point the resistance goes up very quickly. this would reduce the gain of amp IC 101 B drastically until capacitor C 106, which charges up in response to signals, could discharge. A large signal across this capacitor would keep it charged and it would take a long time for the signal to bleed off. Therefore, if diode D 102 was not connected, a large signal could charge the capacitor keeping the FET at a high impedence, and one would not be able to hear weaker sounds played immediately after it. The discharge time of capacitor C 106 is set long enough to produce smooth decay of sounds in the guitar frequency range.

On a guitar the first sound or pulse that comes out can be a huge peak which is almost always much stronger than the signal which follows within a few milliseconds. A guitar amplifier tends to smooth out these sounds because it cannot respond to them fast enough, because it clips (distorts) large signals, and because the speakers have slow response. If the amplifier is turned up high it will simply distort the output amp or the speaker or both for those few milliseconds, and one will hear extra harmonics on the front of the note, without any large pulse coming through.

In accordance with the invention for louder notes, the signal is normally compressed, and the peaks are held to just below where the op amp is starting to clip. The signal immediately following is amplified up to this same point as capacitor C 106 discharges within about 50 milliseconds or less. Any extra signal will not be compressed since the diode D 102 prevents the signal at the FET from surpassing a certain limit.

Thus for overly large signals, the peak of the signal will cause distortion of the op amp TC 101 B, which is acceptable because distortion is a widely understood indicator that the input signal is too large, and the musician will likely reduce the volume of the instrument. Also, the clipping (distortion) of peaks is often accepted as normal for guitar amplifiers.

The network 30 shown in FIG. 2 will be described as to its function hereinafter. This network includes a resistor R1 and R2, a capacitor C1 and C2 and switch contacts K1 and K2. The contacts K1 and K2 may be ganged to the switch SW101 for operation thereof.

In connection with the circuit of FIG. 2, it is noted that there is provided a capacitor C104 associated with the transistor Q101. this capacitor has a relatively high value and is used primarily only as a blocking capacitor to block DC. Capacitor C104 has little or no effect on the audio signal itself.

The network 30 is incorporated along with other changes from the previous circuit shown in the copending application in order to enhance operation. In particular, in the distortion position of operation, there is a modification made so as to have lower noise. There is also provided in the edge position and optionally in the distortion position a high end boost, particularly at low volume. Finally, in accordance with the invention, there is provided operation that enables better weak note recovery. In the previous circuit, the FET has a relatively low resistance at idle and the overall gain of the circuit which is a function of the resistor R110 and the FET resistance is quite high because of the low resistance of the FET. This assumes that in the prior circuit there is a direct connection from the capacitor C104 to the amplifier IC101B. The gain may be on the order of 200 under that circumstance. The problem with the large gain is that this also means that there is significant amplification of noise. This fact, coupled with the fact that the distortion amplifier 16 also has considerable gain means that there is excessive noise and the purpose of the present invention is to incorporate a network and make other changes in the circuit so as to reduce this noise. Primarily, the noise is reduced by inserting the resistors R1 and R2 in series with the FET transistor and the operational amplifier. When this is done, the gain is then 160K/3.5K. In fact, the gain is more a function of the resistors R1 and R2 than of the FET resistance. In the above example, the gain is now reduced to on the order of 30 instead of 200. This has the effect of also substantially reducing noise. However, the decrease in gain is to be compensated for by increasing the gain elsewhere and in this regard, there is provided the resister R103 which is increased in value. In this connection, the switch SW100 shown in FIG. 2 is open in the distortion position of operation. This has the effect of moving the corner of the roll off of the high pass filter down in frequency so that you obtain more gain at mid-range but not at the high end. Therefore, the resistance of the resistor 103 is increased to provide increased gain except for high frequencies.

Another change that has been incorporated is the addition of the capacitor C1 and C2. In the distortion or edge mode of operation, for large amplitude signals there are substantial harmonics that are added and one way of compensating is to turn down the treble at the output of the distortion amplifier. thus, one solution is to use a low pass filter at the output of the distortion amplifier. However, the use of a low pass filter provides muffled sounds at low volume when distortion harmonics are absent because of the loss of the high end. Accordingly, instead, the capacitors C1 and C2 have been substituted. These capacitors provide high end boost at low volume. For example, at low frequencies the gain is on the order of 50 because the impedance of the capacitors is high. However, at high frequencies, the capacitors C1 and C2 approach a short circuit and thus the gain is quite substantial, possibly on the order of 200. Thus, the addition of the capacitors provides for high end boost at low volume. In addition, there may be provided a further series resistor in series with, for example, capacitor C1. This has the effect that for very high frequencies there will be reduction in gain so that there is not such a drastic change to a gain as high as 200.

Thus, for high amplitude signals the resistance of the transistor Q101 increases and so the gain of the circuit decreases. For low as well as high frequencies, the transistor Q101 and resistor 105 control at high amplitudes so that the capacitors C1 and C2 do not have any effect. This is the desired type of operation. As the resistance of Q101 increases the additional high frequency signal passed by C1 and C2 becomes negligible. This operation is desireable because at low amplitudes it provides a high end boost to compensate for a high cut filter after the distortion amplifier, without affecting the desired filtering of large amplitude signals fed into the distortion amplifier.

Figure 3:
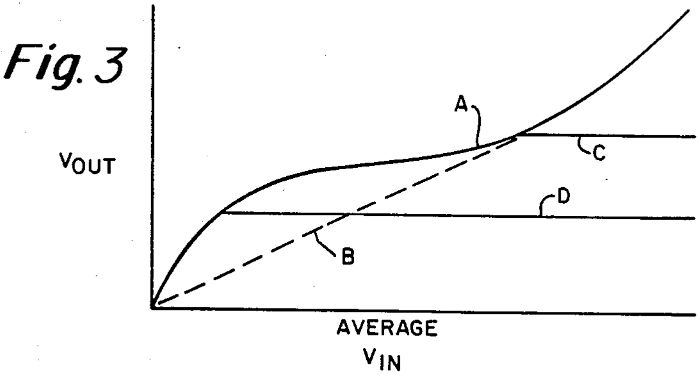
FIG. 3 is a graph of input voltage versus output voltage in accordance with one version of the invention.
Figure 4:
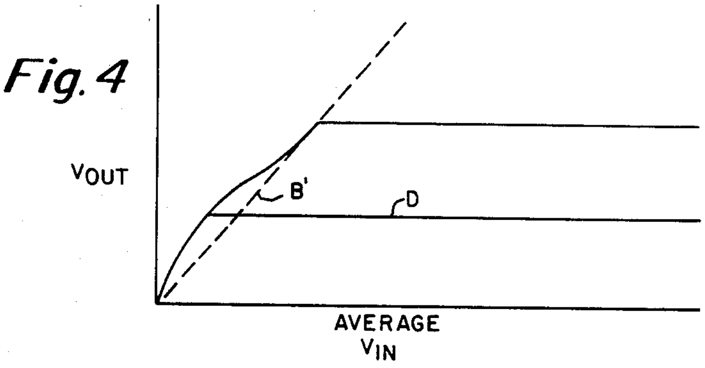
FIG. 4 is a graph of input voltage versus output voltage in accordance with another version of the invention.

It is also noted that there is one other aspect of the present invention which is apparent from reference to the graphs shown in FIGS. 3 and 4. In this connection reference is made to FIG. 3 which shows a graph of input voltage versus output voltage as identified in FIG. 2. It is noted that at the beginning of the curve, the slope at idle gain is relatively high. this is where the gain is, for example, on the order of 200. As the FET transistor starts to conduct, then the gain of the feedback loop decreases and this is were the curve starts to flatten out. the curve again reverses at point A and follows a straight line as shown by the dotted line at B. This dotted line represents the linear nature of the gain due to the resistor R105 which is a 9 K resistor. The slope of the gain is thus approximately 160/9. This is a condition wherein the FET resistance in parallel with the resistor R105 is very substantial. FIG. 3 also shows the point C where the op amp clips.

The operation in accordance with the graph of FIG. 3, however, has not been found to be optimized, particularly in the distortion mode of operation. In practice, when a loud note is followed by a soft note, the transition does not follow the curve depicted therein exactly because of the time constants in the circuit. Also, the FET transistor cannot change fast, in a downward direction, so that the op amp tends to act as a fixed gain amplifier when a hard note is quickly followed by a weaker note; there is a tendency for the weak note to start quietly and ride up to the previous hard note volume. This is typically represented by a linear curve such as curve B corresponding to a hard note voltage E.

The distortion amplifier 14 clips signals above the level C shown in FIG. 3. Once again, if a quiet or weak note is played, what occurs is that in the distortion mode of operation by virtue of the slope of the curve B in FIG. 3, one falls below the distortion output that is noted at point D. The second note has dropped below the distortion amp clipping level as represented by level D. this is not desired. To correct this, the input resistor shown as a 20 K resistor and as resistor R103 in FIG. 2 is increased to a value on the order of 68K so that the sloped dotted line B' in FIG. 4 is at a slope of substantially two or three times that shown in FIG. 3. This has the effect of still maintaining the weaker note above the distortion output level D which is the desired mode of operation.

For low amplitude signals the increase in value of resistor R103 causes an increase in gain, but this is compensated for by reducing the gain of the amplifier IC-101B by inserting resistor R2 in series with transistor Q 101.

FIG. 2 also shows the contacts K1 and K2. in the edge mode of operation, both of these contacts are open. In the distortion mode of operation, the contact K1 is closed and the contact K2 is open. In the clean mode of operation, both of these contats are closed so that the circuit essentially operates in accordance with prior operation. The switch SW100 is closed in the edge mode of operation. Incidentally, in connection with the graph shown in FIG. 4, it is understood that this mode of operation is only found in the distortion mode of operation when the resistor R103 is n the circuit. In the other modes of operation the other switch SW100 is closed and thus this change in slope is not realized.

What is claimed is:

1. An electronic audio signal processor for processing signals in the audio frequency range, comprising:
   - a high pass audio filtering circuit for receiving an electrical audio input signal;
   - an audio signal compressor circuit for receiving the output of said high pass audio filter and for producing an output signal,
   - said compressor circuit comprising an amplifier having first and second inputs with the first input of the amplifier for receiving the output of said high pass audio filter,
   - and a feedback circuit comprising a semiconductor control transistor connected in series with impedance means,
   - said feedback circuit connecting from the output of said amplifier to said second input thereof,
   - said feedback circuit adapted to control the compression of the amplitude range of the signal appearing at the first input of said amplifier,
   - said semiconductor control transistor having an output electrode coupled to said impedance means,
   - said impedance means comprising an R-C circuit for providing both noise suppression and high end boost at low volume,
   - said R-C circuit comprising at least one resistor, at least one capacitor and conductor means connecting the resistor and capacitor in parallel between the transistor output electrode and said amplifier second input.

2. An electronic audio signal processor as set forth in claim 1 wherein said impedance means comprises a pair of series connected resistors.

3. An electronic audio signal processor as set forth in claim 2 wherein said at least one capacitor couples in parallel with one of said resistors.

4. An electronic audio signal processor as set forth in claim 3 wherein said impedance means comprises a pair of capacitors each coupled in parallel with said respective pair of resistors.

5. An electronic audio signal processor as set forth in claim 4 wherein said audio filtering circuit includes a resistance on the order of at least 5 K ohms.

6. An electronic audio signal processor as set forth in claim 1 wherein said highpass audio filtering circuit comprises an audio filter having a relatively high value resistor associated therewith on the order of at least 5 K ohms.

7. An electronic audio signal processor as set forth in claim 6 including an input circuit at the amplifier including second and third resistors in series with the audio filter resistor and furthermore having a switch across said third resistor.

8. An electronic audio signal processor as set forth in claim 1 wherein said semiconductor control transistor comprises a field effect transistor said impedance means comprising a pair of capacitors and pair of resistors the capacitors each coupled in parallel with the resistors and further including switch contact means one in parallel with each of said parallel arranged resistors and capacitors.

9. An electronic audio signal processor as set forth in claim 8 including an input circuit associated with the field effect transistor and comprising a pair of resistors, a capacitor, and a pair of diodes connected in a series circuit to the control electrode of the field effect transistor.

10. An electronic audio signal processor as set forth in claim 1 wherein said R-C circuit includes a pair of series connected resistors and a pair of series connected capacitors.

11. An electronic audio signal processor as set forth in claim 10 including means for connecting the resistors in parallel with the capacitors and switch contacts also connected in parallel across the capacitors and resistors.

12. An electronic audio signal processor for processing signals in the audio frequency range, comprising:

a high pass audio filtering circuit for receiving an electrical audio input signal;

an audio signal compressor circuit for receiving the output of said high pass audio filter and for producing an output signal, said compressor circuit comprising an amplifier having first and second inputs with the first input of the amplifier for receiving the output of said high pass audio filter, and a feedback circuit comprising a semiconductor control transistor connected in series with impedance means, said feedback circuit connecting from the output of said amplifier to said second input thereof, said feedback circuit adapted to control the compression of the amplitude range of the signal appearing at the first input of said amplifier, said semiconductor control transistor having an output electrode coupled to said impedance means, said impedance means comprising an R-C circuit for providing both noise suppression and high end boost at low volume, said impedance means comprising a pair of series connected resistors, said impedance means comprising a pair of capacitors each coupled in parallel with said respective pair of resistor, wherein said impedance means also comprises switch contact means one in parallel with each of said parallel arranged resistors and capacitors.

13. An electronic audio signal processor for processing signals in the audio frequency range, comprising:

a high pass audio filtering circuit for receiving an electrical audio input signal;

an audio signal compressor circuit for receiving the output of said high pass audio filter and for producing an output signal, said compressor circuit comprising an amplifier having first and second inputs with the first input of the amplifier for receiving the output of said high pass audio filter, and a feedback circuit comprising a semiconductor control transistor connected in series with impedance means, said feedback circuit connecting from the output of said amplifier to said second input thereof, said feedback circuit adapted to control the compression of the amplitude range of the signal appearing at the first input of said amplifier, said semiconductor control transistor having an output electrode coupled to said impedance means, said impedance means comprising an R-C circuit for providing both noise suppression and high end boost at low volume, said R-C circuit including a pair of series connected resistors and a pair of series connected capacitors, means for connecting the resistors in parallel with the capacitors, and switch contacts also connected in parallel across the capacitors and resistors.

14. An electronic audio signal processor as set forth in claim 13 including a third resistor coupled from one of the resistors of the pair to a voltage potential.

15. An electronic audio signal processor as set forth in claim 14 including a third capacitor coupled in series from the control transistor to resistor pair.

* * * * *